United States Patent [19]

Miyazaki

[11] Patent Number: 5,081,713
[45] Date of Patent: Jan. 14, 1992

[54] RADIO TRANSMITTER CAPABLE OF COMPENSATING FOR A FREQUENCY CHARACTERISTIC OF AN ANTENNA AND/OR A COUPLING CIRCUIT

[75] Inventor: Shinichi Miyazaki, Tokyo, Japan

[73] Assignee: NEC Corporation, Tokyo, Japan

[21] Appl. No.: 514,807

[22] Filed: Apr. 26, 1990

[30] Foreign Application Priority Data

Apr. 27, 1989 [JP] Japan .................. 1-106014

[51] Int. Cl.⁵ .................. H04B 1/40; H04B 1/04
[52] U.S. Cl. .................. 455/76; 455/115; 455/116; 455/117; 455/126
[58] Field of Search .................. 455/69, 75, 115, 117, 455/119, 125–127, 123, 76, 116; 330/129, 137, 279, 294

[56] References Cited

U.S. PATENT DOCUMENTS

| | | | |
|---|---|---|---|
| 3,891,926 | 6/1975 | Ishman et al. | 325/159 |
| 4,429,285 | 1/1984 | Bradshaw | 330/279 |
| 4,727,337 | 2/1988 | Jason | 330/298 |
| 4,870,698 | 9/1989 | Katsuyama et al. | 455/67 |
| 4,932,073 | 6/1990 | Ueda | 455/113 |
| 4,939,786 | 7/1990 | McCallum et al. | 455/67 |

FOREIGN PATENT DOCUMENTS 0176303 4/1986 European Pat. Off. .......... 330/12 G

Primary Examiner—Reinhard J. Eisenzopf
Assistant Examiner—Chi H. Pham
Attorney, Agent, or Firm—Sughrue, Mion, Zinn, Macpeak & Seas

[57] ABSTRACT

In a radio transmitter responsive to an input signal for transmitting an output signal through a coupling circuit and an antenna with a radio channel assigned to the output signal, a power level of the output signal is kept constant with reference to a frequency characteristic of the antenna and/or the coupling circuit. The output signal is produced from an amplifier section controlled by a reference voltage which is supplied from a reference voltage generator (27) controlled by a reference voltage controller (23). The reference voltage controller produces a reference voltage control signal which is based on the frequency characteristic and which is used for adjusting the reference voltage. In addition, the reference voltage control signal may be produced with reference to a temperature characteristic of a detector for detecting the output signal.

4 Claims, 4 Drawing Sheets

RADIO TRANSMITTER CAPABLE OF COMPENSATING FOR A FREQUENCY CHARACTERISTIC OF AN ANTENNA AND/OR A COUPLING CIRCUIT

BACKGROUND OF THE INVENTION

This invention relates to a radio transmitter for use in a mobile telephone system, a multichannel access (MCA) system, or the like to transmit an output signal in response to an input signal.

A radio transmitter of the type described comprises an amplifier section which will mainly be specified by a high frequency power amplifier which forms an output stage of the amplifier section and which is connected to an antenna, although an intermediate frequency amplifier and a low frequency amplifier are also included in the amplifier section. Specifically, the high frequency power amplifier may be considered as a combination of a variable gain high frequency power amplifier circuit and a high frequency power amplifier circuit. The variable gain high frequency amplifier circuit is supplied with an internal signal derived from an input signal to produce a gain controlled signal while the high frequency power amplifier circuit amplifies the gain controlled signal into the output signal.

In such a radio transmitter, it is necessary to stably keep an output signal at a predetermined level. In other words, an output transmission power level should be preferably held substantially constant in the radio transmitter. To this end, an automatic level control (ALC) circuit is used in combination with the high frequency power amplifier.

The automatic level control circuit comprises a detector supplied with the output signal to produce a detection signal, namely, a d.c. signal specifying a power level of the output signal. The detection signal is sent to a comparator and is compared in the comparator with a reference signal predetermined for the power level of the output signal to produce a control signal representative of a difference between the detection signal and the reference signal. The control signal is delivered to a power source control circuit which is connected to the variable gain high frequency power amplifier circuit and which is also connected to a power source. Supplied with the control signal, the power source control circuit controls the power source to supply controlled electric power to the variable gain high frequency power amplifier circuit and to thereby control a gain of the variable gain high frequency power amplifier circuit. As a result, the gain controlled signal is sent from the variable gain high frequency power amplifier circuit to the high frequency power amplifier circuit to be produced as the output signal. Thus, the output signal has an output level determined by the reference signal given to the comparator circuit.

It is to be noted here that the detector is implemented by a semiconductor or a primary diode which has a temparature characteristic and that the antenna has a frequency characteristic like in a coupling circuit between the high frequency power amplifier and the antenna. Therefore, the detection signal is varied in its amplitude in dependency upon the temparature characteristic of the primary diode. In addition, the detection signal is also varied by the frequency characteristic of the antenna or the coupling circuit when frequencies are changed from one to another. Inasmuch as the level of the output signal is determined by the detection signal, as mentioned before, the output signal is varied in dependency upon the detection signal even when the reference signal is kept constant.

Heretofore, it is known in the art to compensate for the temperature characteristic of the semiconductor or primary diode by the use of a subsidiary diode having the same temperature characteristic as the primary diode.

However, no attempt has been tried to compensate for the frequency characteristic of the antenna or the coupling circuit except that the coupling circuit is subtly adjusted.

SUMMARY OF THE INVENTION

It is an object of this invention to provide a radio transmitter which is capable of compensating not only for a temperature characteristic of a diode but also for a frequency characteristic of an antenna or a coupling circuit.

It is another object of this invention to provide a radio transmitter of the type described, which is capable of stably keeping a level of an output signal even when the temperature and the frequency characteristics are present in the diode and the antenna or the coupling circuit.

A radio transmitter to which this invention is applicable is supplied with an input signal for transmitting an output signal having a level. According to this invention, the radio transmitter comprises an amplifier section responsive to an internal signal resulting from the input signal for producing the output signal, a reference voltage supplying circuit for supplying the amplifier section with a reference voltage signal having a reference voltage to control the level of the output signal, a temperature detection circuit for detecting a temperature on a part of the radio transmitter to produce a temperature signal representative of the temperature, transmission frequency determining means for determining a transmission frequency for the input signal to produce a frequency control signal indicative of the transmission frequency, reference voltage control means supplied with the frequency control signal and the temperature signal for controlling the reference voltage signal based on the frequency control signal and the temperature signal, and internal signal supplying means connected to the amplifier section and responsive to both the frequency control signal and the input signal for supplying the internal signal to the amplifier section.

Description of the Preferred Embodiment

Figure 1:
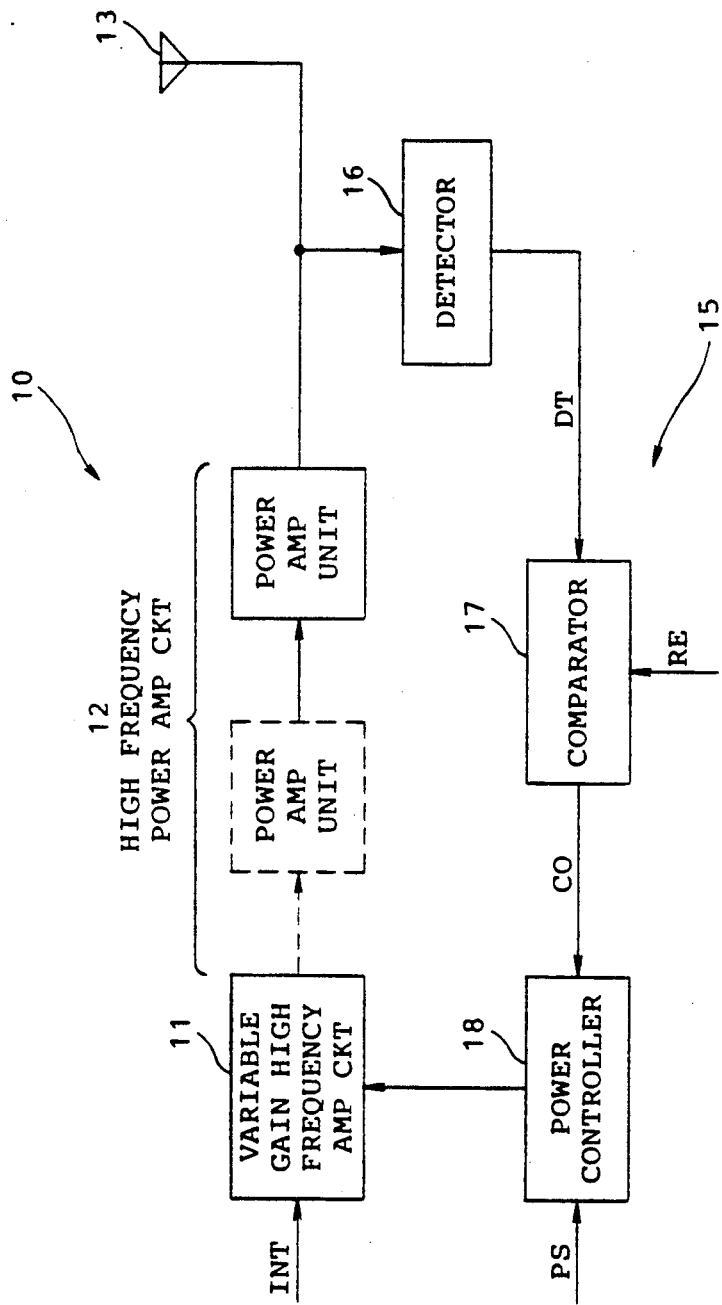
FIG. 1 is a block diagram of a conventional radio transmitter.

Referring to FIG. 1, a conventional radio transmitter comprises an amplifier section which is collectively depicted at 10 in FIG. 1 and which is specified by a variable gain high frequency amplifier circuit 11 and a high frequency power amplifier circuit 12. The variable gain high frequency amplifier circuit 11 is connected to a lower stage of amplifiers (not shown) and is supplied from the lower stage with an internal signal INT resulting from an input signal, such as an audio signal. The variable gain high frequency amplifier circuit 11 has a gain controllable in a manner to be described and produces a gain controlled signal. On the other hand, the high frequency power amplifier circuit 12 comprises a plurality of power amplifier units connected in cascade to one another and amplifies the gain controlled signal into an output signal which has a high frequency and a level corresponding to transmission power. The output signal is sent through a coupling circuit to an antenna 13 and produced as a radio signal.

In the example being illustrated, the amplifier section 10 is connected to an automatic level control (ALC) circuit 15 which comprises a detector 16 which is implemented by a semiconductor diode and which is supplied with the output signal from the high frequency power amplifier circuit 12. The detector 16 detects the output signal to produce a detection signal DT of a d.c. voltage corresponding to the transmission power of the output signal. The detection signal DT is sent to a comparator 17 which is supplied with a reference signal RE of a d.c. voltage from a reference signal generator (not shown in this figure). The reference signal RE is determined for a desired transmission power of the output signal. The comparator 17 compares the detection signal DT with the reference signal RE to produce a control signal CO representative of a result of comparison between the detection signal DT and the reference signal RE. The control signal CO is supplied to a power controller 13 which is connected to an electric power source (not shown) and which is given a source voltage PS. The source voltage PS is controlled by the control signal CO. As a result, the variable gain high frequency amplifier circuit 11 is supplied with controlled electric power from the power controller 18 to keep the transmission power of the output signal at desired transmission power.

At any rate, the transmission power of the output signal is adjusted to the desired transmission power by comparing the detection signal DT with the reference signal RE.

However, no consideration is made about compensating for a temperature characteristic of the detector 16 and a frequency characteristic of each of the coupling circuit and the antenna 13. Accordingly, the illustrated radio transmitter has disadvantages, as pointed out in the preamble of the instant specification.

Figure 2:
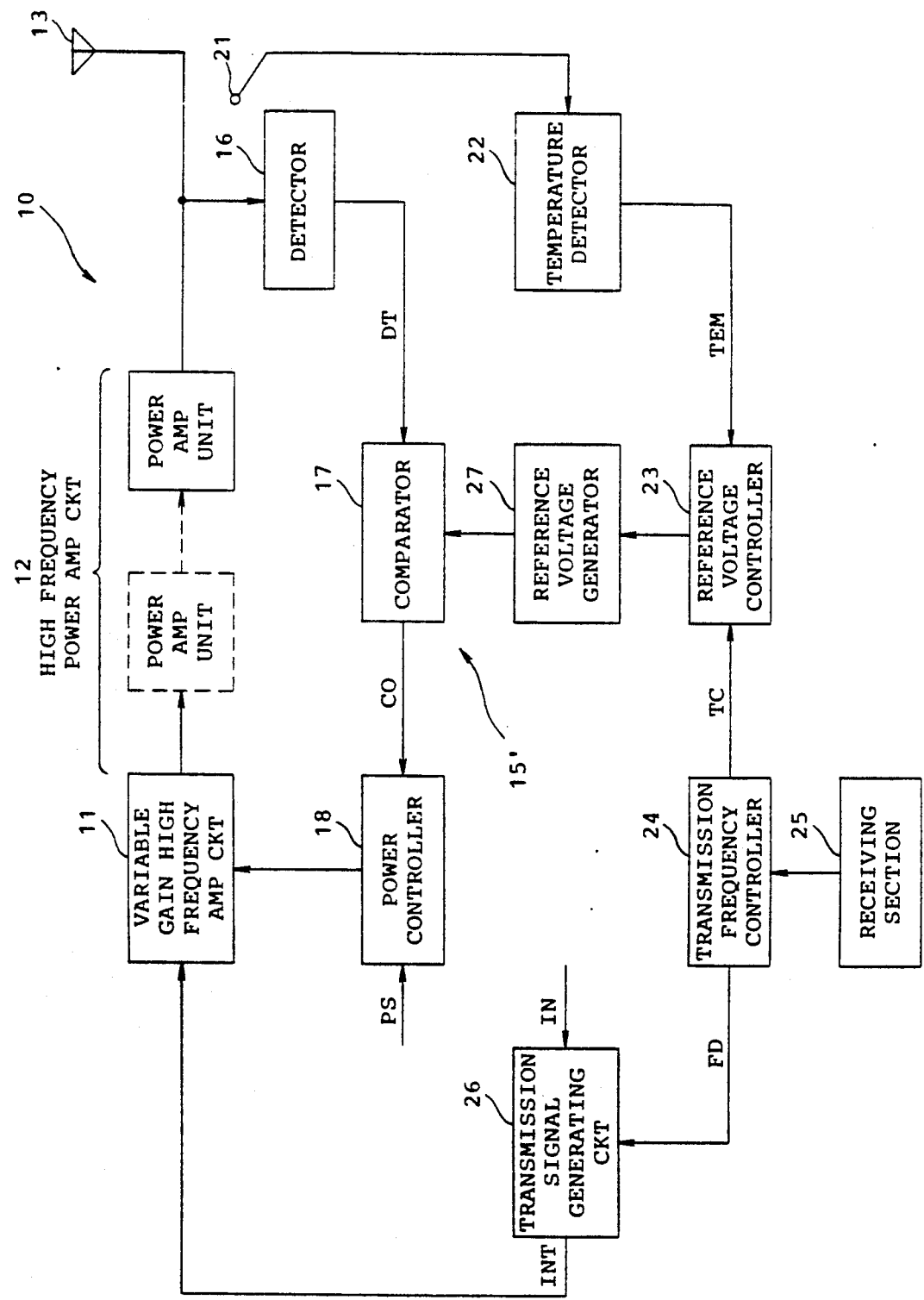
FIG. 2 is a block diagram of a radio transmitter according to a preferred embodiment of this invention.
Figure 3:
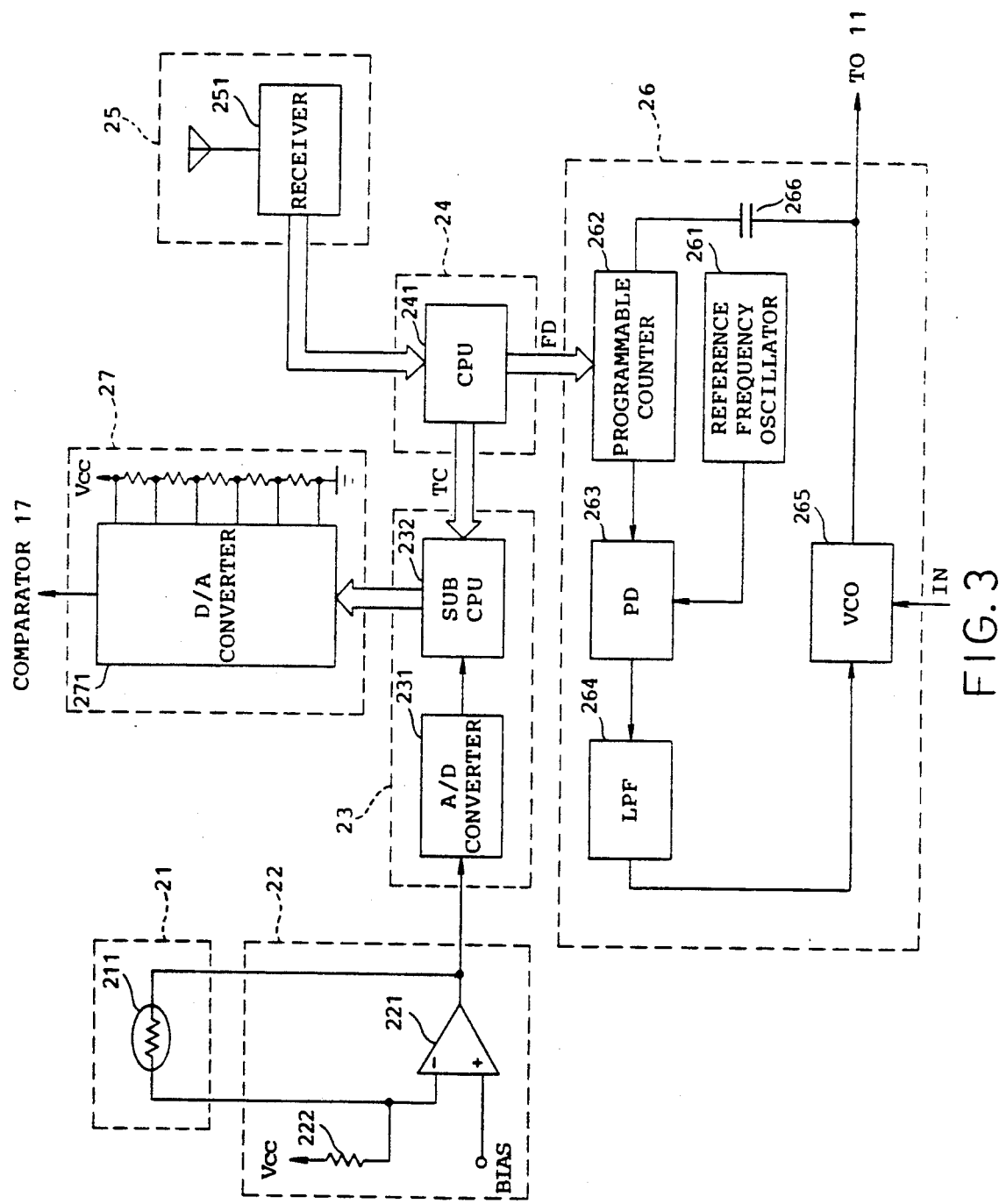
FIG. 3 is a block diagram for use in describing in detail a part of the radio transmitter illustrated in FIG. 2.

Referring to FIGS. 2 and 3, a radio transmitter according to a preferred embodiment of this invention comprises similar parts designated by like reference numerals and symbols. In the illustrated example, it is assumed that the radio transmitter is assigned with a plurality of radio channels which have different frequencies from one another and one of which is selected as a selected channel on transmission.

In FIGS. 2 and 3, an automatic level control circuit 15' serves to compensate for a temperature characteristic of a diode placed in the detector 16 and a frequency characteristic of the coupling circuit and the antenna 13. In order to compensate for the temperature characteristic of the diode, a temperature sensor 21 is located at a position adjacent to the detector 16.

As shown in FIG. 3, the temperature sensor 21 may be, for example, a thermistor 211 and may be attached to a housing of the amplifier section 10 or may be very close to the detector 16. At any rate, the temperature sensor 21 detects a temperature at the position and produces an electric signal related to the temperature and which appears in the form of an analog signal. In other words, a variation of the temperature brings about a variation of resistance of the thermistor 211 and varies the analog signal. Thus, the analog signal is varied in dependency upon the temperature and is sent to a temperature detector 22 which is formed by a differential amplifier 221 which has a positive input terminal connected to a bias circuit (not shown) and a negative input terminal connected to the thermistor 211 and a voltage source symbolized by Vcc, as shown in FIG. 3. Therefore, the thermistor 211 is connected to the differential amplifier 221 as a feedback resistor.

Consequently, the temperature detector 22 supplies a reference voltage controller 23 with an analog temperature signal TEM representative of the temperature sensed by the temperature sensor 21.

As illustrated in FIG. 2, the reference voltage controller 23 is connected to a transmission frequency controller 24 which is in turn connected to both a receiving section 25 and a transmission singal generating circuit 26. In addition, a reference voltage generator 27 is connected to and controlled by the reference voltage controller 23.

Referring to FIG. 3 together with FIG. 2, the receiving section 25 comprises a receiver 251 operable in receiving a data signal as a reception data signal from another station that may be usually a base station. The reception data signal received through the receiver 251 includes a channel indication signal indicative of a transmission channel for the radio transmitter and is delivered to the transmission frequency controller 24 formed by a central processing unit (CPU) 241.

In the transmission frequency controller 24, the central processing unit 241 processes the reception data signal between the receiver 251 and the base station. In this event, the channel indication signal is processed by the central processing unit 241 into a frequency division signal FD which is representative of a factor of frequency division preassigned to each of the channels. The factor may be referred to as a division factor. From this fact, it is readily understood that the frequency division signal FD is made to correspond to a transmission frequency of each channel. The CPU 241 at first checks whether or not the channel indication signal indicates a change of channels. If the change of channels is indicated by the channel indication signal, a transmission channel is determined from the channel indication signal by the CPU 241. Such determination of the transmission channel can be used by a memory accessed by the channel indication signal. Inasmuch as the transmission channel has a transmission frequency predetermined therefor, a division factor is determined for the transmission frequency by the CPU 241 and is given to a programmable counter 262 as the frequency division signal FD. The division factor can be accomplished by a memory accessed by the transmission frequency. At any rate, a particular program is not necessary to accomplish the operation of the CPU 241. Likewise, the central processing unit 241 also produces a transmission channel signal TC representative of each channel. Both the frequency division signal FD and the transmission channel signal TC may be collectively referred to as a frequency control signal indicative of the transmission frequency. At any rate, the transmission frequency controller 24 is operable to determine the transmission frequency necessary for transmitting the input signal IN.

The frequency division signal FD and the transmission channel signal TC are sent to the transmission signal generating circuit 26 and the reference voltage controller 23, respectively.

In FIG. 3, the transmission signal generating circuit 26 is supplied with the input signal IN, such as an audio signal, in addition to the frequency division signal FD, as shown in FIG. 2. The transmission signal generating circuit 26 comprises a reference frequency oscillator 261 which oscillates a reference frequency signal having a reference frequency and the programmable counter 262 supplied with the frequency division signal FD and with a transmission frequency signal which is produced in a manner to be described later. The programmable counter 262 divides the transmission frequency into a frequency divided signal in accordance with the division factor represented by the frequency division signal FD. The frequency divided signal is delivered to a phase detector (PD) 263 together with the reference frequency signal. The phase detector 263 compares the frequency divided signal with the reference frequency signal to produce a difference signal representative of a phase or a frequency difference between the frequency divided signal and the reference frequency signal. The difference signal is usually given by a d.c. signal and is sent through a low pass filter (LPF) 264 to a voltage controlled oscillator (VCO) 265 supplied with the input signal IN. As known in the art, the voltage controlled oscillator 265 varies an oscillation frequency in response to the difference signal sent from the phase detector 263 and obtains an oscillation frequency signal which has a frequency equal to a transmission frequency assigned to the selected channel. In the example being illustrated, such an oscillation frequency signal is subjected by the input signal IN to frequency modulation in the voltage controlled oscillator 265 and is transmitted to the variable gain high frequency amplifier circuit 11 (FIG. 2) as a controlled input signal on one hand and to the programmable counter 262 through a capacitor 266 as the transmission frequency signal. The controlled input signal is delivered as the internal signal to the variable gain high frequency amplifier circuit 11. This shows that the illustrated internal signal INT is frequency modulated and has the transmission frequency assigned to the selected channel.

Further referring to FIGS. 3 and 2, the reference voltage controller 23 is operable in response to the analog temperature signal TEM and the transmission channel signal TC representative of the selected channel. More specifically, the analog temperature signal TEM is given to an analog-to-digital converter 231 and is converted into a digital temperature signal by the analog-to-digital converter 231. The digital temperature signal is supplied to a subsidiary central processing unit (abbreviated to SUBCPU) 232 along with the transmission channel signal TC. The SUBCPU 232 serves to compensate for the temperature characteristic of the detector 16 and the frequency characteristic of the antenna 13 and the coupling circuit.

Figure 4:
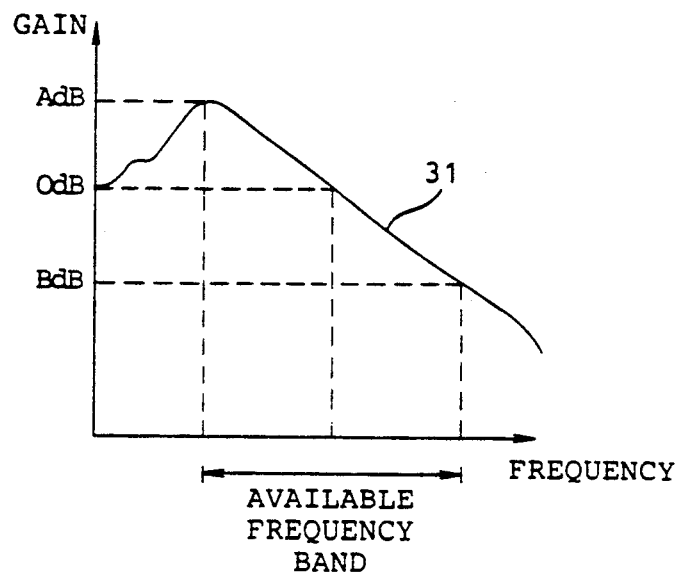
FIG. 4 is a graphical representation of a frequency characteristic of an antenna.

Temporarily referring to FIG. 4, wherein an abscissa and an ordinate represent a frequency and a gain, respectively, it is assumed that the antenna 13 illustrated in FIG. 2 has a frequency characteristic, as specified by a curve 31, and that the antenna 13 is used within an available frequency band specified by an upper limit frequency and a lower limit frequency. The illustrated frequency characteristic exhibits gains A dB and B dB at the lower and the upper frequency limits, respectively, as readily understood from the curve 31. Therefore, a gain difference (A−B) dB appears when the antenna 13 is driven at the lower and the upper frequency limits, unless the frequency characteristic is not compensated.

Figure 5:
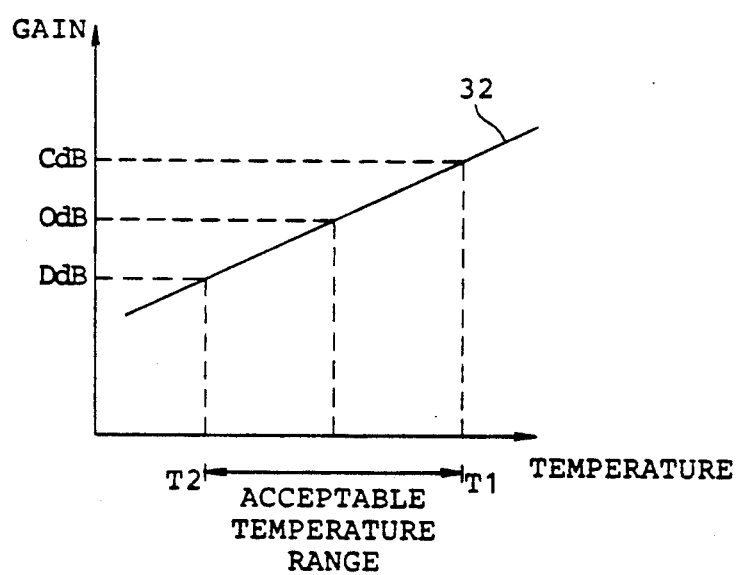
FIG. 5 is a graphical representation of a temperature characteristic of a detector.

Further referring to FIG. 5, wherein an abscissa and an ordinate represent a temperature and a variation of the output signal level, respectively, it is also assumed that the detector 16 has a frequency characteristic which is specified by a curve 32 and that the detector 16 has an acceptable temperature range within a first temperature T1 and a second temperature T2 lower than the first temperature T1. In the example being illustrated, the detector 16 has the output signal levels C dB and D dB at the first and the second temperatures T1 and T2 and a level difference (C−D) dB.

From FIGS. 4 and 5, it is apparent that a maximum level and a minimum level of the output signal can be equivalently represented by (A+C) dB and (B+D) dB, respectively. Practically, the maximum and the minimum levels should be restricted to a range between +2 dB and −4 dB in the radio transmitter for the mobile telephone system, where 0 dB is representative of a reference level.

Referring back to FIG. 3, the SUBCPU 232 is loaded with a first set of compensation signals which compensate for variations of gains of the detector 16 resulting from the temperature characteristic as illustrated in FIG. 5 and with a second set of compensation signals which compensate for the gain difference resulting from variations of the frequency characteristic of the antenna 13. The first set of the compensation signals are memorized at each temperature indicated by the digital temperature signal in an internal memory of the SUBCPU 232 while the second sets of compensation signals are held in the internal memory at every channel.

Supplied with the digital temperature signal and the transmission channel signal TC, the SUBCPU 232 reads a selected one of the compensation signals of the first set and a selected one of the compensation signals of the second set from the internal memory. Both the selected ones of the compensation signals are processed in an internal processor of the SUBCPU 232. The internal processor calculates, from the selected ones of the compensation signals, a reference voltage control signal RC indicative of a reference voltage which is necessary for keeping the output signal constant. The reference voltage control signal RC is sent to the reference voltage generator 27 to control a reference voltage RE. Thus, the reference voltage controller 23 serves to control the reference voltage signal RE based on the transmission channel signal TC and the analog temperature signal TEM.

As mentioned above, the first and the second sets of compensation signals are memorized in an internal memory at every temperature and at every channel. This shows that the digital temperature signal and the transmission channel signal TC are supplied to the internal memory of the SUBCPU 232 as address signals. Accessed by the address signals, the internal memory produces selected ones of the first-set and the second-set compensation signals from addresses indicated by the address signals. In this event, each reference voltage is predetermined for both selected compensation signals and may be memorized in the internal memory or another memory. Therefore, both the selected compensation signals may be delivered as address signals to the internal memory or another memory. Thus, the SUBCPU 232 can be simply structured by a combination of memories.

The reference voltage generator 27 comprises a digital-to-analog (D/A) converter 271 and supplies the comparator 17 (FIG. 2) with the reference voltage RE indicated by the reference voltage control signal RC.

Thus, the reference voltage signal RE is determined by the reference voltage control signal RC dependent on the analog temperature signal TEM and the transmission channel signal TC. Accordingly, the temperature characteristic detected at a position adjacent to the detector 16 and the frequency characteristic of the antenna 13 can be preferably compensated by producing the compensation signals in consideration of the temperature and the frequency characteristics from the reference voltage controller 23.

While this invention has thus far been described in conjunction with a preferred embodiment thereof, it will readily be possible for those skilled in the art to put this invention into practice in various other manners. For example, only the frequency characteristic of the antenna and/or the coupling circuit may be compensated without compensation of the temperature characteristic of the detector.

What is claimed is:

1. A radio transmitter supplied with an input signal for transmitting an output signal having a level, comprising:
    an amplifier section responsive to an internal signal resulting from said input signal for producing said output signal;
    a reference voltage supplying circuit for supplying said amplifier section with a reference voltage signal having a reference voltage to control the level of said output signal;
    a temperature detection circuit for detecting a temperature on a part of said radio transmitter to produce a temperature signal representative of said temperature;
    transmission frequency determining means for determining a transmission frequency for said input signal to produce a frequency control signal indicative of said transmission frequency;
    reference voltage control means supplied with said frequency control signal and said temperature signal for controlling said reference voltage signal based on said frequency control signal and said temperature signal; and
    internal signal supplying means connected to said amplifier section and responsive to both said frequency control signal and said input signal for supplying said internal signal to said amplifier section.

2. A radio transmitter as claimed in claim 1, said output signal being transmitted through a selected one of radio channels that has a frequency different from one another and that is determined as said transmission frequency by said transmission frequency determining means, wherein said internal signal supplying means is supplied with said frequency control signal indicative of the transmission frequency assigned to said selected one of the radio channels and comprises:
    a reference frequency oscillator for oscillating a reference frequency signal having a reference frequency;
    a programmable counter supplied with said frequency control signal and said internal signal for frequency dividing said internal signal into a local frequency divided signal in response to said frequency control signal;
    phase detecting means supplied with said reference frequency signal and said local frequency divided signal for detecting a phase difference between said reference frequency signal and said local frequency divided signal to produce a phase difference signal indicative of said phase difference;
    voltage controlled oscillator means supplied with said input signal and said phase difference signal for producing a controlled input signal by said phase difference signal; and
    means for producing said controlled input signal as said internal signal.

3. A radio transmitter as claimed in claim 1, said temperature signal being produced as an analog temperature signal, wherein said reference voltage control means comprises:
    an analog to digital converter for converting said analog temperature signal into a digital temperature signal;
    reference voltage signal producing means supplied with said frequency control signal and said digital temperature signal for producing a reference voltage control signal which controls said reference voltage signal; and
    means for supplying said reference voltage control signal to said reference voltage supplying circuit to control said reference voltage signal.

4. a radio transmitter supplied with an input signal for transmitting an output signal having a level, comprising:
    an amplifier section responsive to an internal signal resulting from said input signal for producing said output signal;
    a reference voltage supplying circuit for supplying said amplifier section with a reference voltage signal having a reference voltage to control the level of said output signal;
    transmission frequency determining means for determining a transmission frequency for said input signal to produce a frequency control signal indicative of said transmission frequency;
    reference voltage control means supplied with said frequency control signal for controlling said reference voltage signal based on said frequency control signal; and
    internal signal supplying means connected to said amplifier section and responsive to both said frequency control signal and said input signal for supplying said internal signal to said amplifier section.

* * * * *

UNITED STATES PATENT AND TRADEMARK OFFICE
CERTIFICATE OF CORRECTION

PATENT NO. : 5,081,713
DATED : Jan. 14, 1992
INVENTOR(S) : Shinichi Miyazaki

It is certified that error appears in the above-identified patent and that said Letters Patent is hereby corrected as shown below:

Col. 3, line 33, delete "13" and insert therefor --18--.

Signed and Sealed this

Twentieth Day of April, 1993

Attest:

MICHAEL K. KIRK

*Attesting Officer*   Acting Commissioner of Patents and Trademarks